June 27, 1967 A. P. ARNTSEN 3,328,720

DUAL MODE OSCILLATOR CIRCUITS

Filed July 15, 1965 2 Sheets-Sheet 1

INVENTOR.
Arnt P. Arntsen
BY
Samuel Ott...

June 27, 1967 A. P. ARNTSEN 3,328,720

DUAL MODE OSCILLATOR CIRCUITS

Filed July 15, 1965 2 Sheets-Sheet 2

3,328,720
DUAL MODE OSCILLATOR CIRCUITS

Arnt P. Arntsen, Manchester, Mass., assignor to Westinghouse Electric Corporation, Pittsburgh, Pa., a corporation of Pennsylvania Filed July 15, 1965, Ser. No. 472,179
8 Claims. (Cl. 331—59)

The present invention relates to tunable oscillator circuits, and more particularly to tunable oscillator circuits which are tunable to frequencies within at least two frequency bands.

Television receivers presently being manufactured in accordance with Federal Communications Commission regulations are equipped for the reception of channels in both the very high frequency (VHF) and ultra high frequency (UHF) bands. It is thus necessary that the television receiver be capable of being tuned to frequencies within both of these frequency bands. The most obvious solution to tuning to the two frequency bands is to provide separate circuitry for each of the VHF and UHF bands. Substantially all presently manufactured television receivers utilize separate tuning and tunable oscillator stages for the separate reception of channels within the two frequency bands. This duplication of tuning functions is of course highly disadvantageous from an economic standpoint. To avoid the requirement of separate tuning circuits in a television receiver, various dual mode tuning circuits operative for both the UHF and VHF frequency bands are taught in copending application Ser. No. 471,174 filed, July 12, 1965, by the same inventor as the present application and assigned to the same assignee. The present invention is directed to providing oscillator circuits which are capable of being tuned within both the VHF and UHF frequency bands without the unnecessary duplication of costly components.

It is therefore an object of the present invention to provide new and improved tunable oscillator circuits.

It is a further object to provide new and improved tunable oscillator circuits operative in at least two modes of oscillation and tunable in at least two frequency bands.

It is a still further object to provide new and improved tunable oscillator circuits tunable in at least two frequency bands which are tunable by a single tuning element in any of the bands.

It is still another object to provide a new and improved resonant circuit adjustably tunable to resonant frequencies within at least two frequency bands.

It is a still further object to provide new and improved tunable oscillator circuits including a circuit adjustable to resonant frequencies within at least two frequency bands with the oscillator circuit being selectively oscillatory in each of the bands.

It is a still further object to provide new and improved tunable oscillator circuits including variable elements therein for adjusting the ends of frequency bands within which the oscillator circuits are tunable.

It is still another object to provide a new and improved tunable oscillator mechanical circuit configuration.

In its broad context, the present invention provides: a tunable oscillator circuit which is operative in at least two modes of oscillation and is tunable within at least two frequency bands, and wherein there is provided resonant circuitry tunable to frequencies within each of the frequency bands, with oscillations being selectively sustained in the oscillator circuit in a desired mode of oscillation, while undesired modes of oscillation are prohibited.

These and other objects and advantages of the present invention will become more apparent when considered in view of the following specification and drawings, in which.

Figure 1:
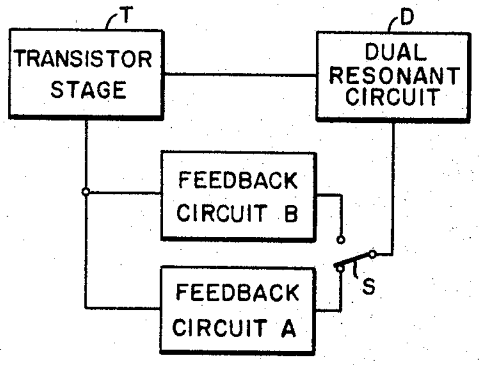
FIG. 1 is a block diagram of one embodiment of the present invention.

Referring now to FIG. 1, a block diagram of one embodiment of the tunable oscillator circuit of the present invention is shown. In this diagram, a transistor stage T is the active element for the oscillator circuit and supplies oscillatory energy thereto. The output of the transistor stage T is applied to a dual resonant circuit D. The function of the dual resonant circuit D is that of being tunable to resonant frequencies within at least two frequency bands. for example, the VHF and UHF frequency bands. Within each of the frequency bands, the dual resonant circuit D is adjustable to be tuned to various resonant frequencies within that band. The circuit D will be discussed in more detail with reference to FIGS. 2 and 3.

The output of the resonant circuit D is applied to a switch S, which may be selectively switched to a feedback circuit A or a feedback circuit B. With the switch S connected as shown, the feedback circuit A will be in the oscillatory loop of the oscillator circuit. The function of the feedback circuit A is to apply feedback signals to the transistor stage T of such a phase and magnitude to satisfy the oscillatory criterion and thus sustain oscillations in the oscillator in a first mode of oscillation at frequencies within one of the frequency bands. The frequency of oscillation is determined by the dual resonant circuit D. For example, assuming that the oscillator circuit is to be tunable within the UHF and VHF frequency bands, with the feedback circuit A in the oscillatory loop, the circuit will oscillate at a frequency within the VHF band as determined by the resonant circuit D. If oscillation is desired in the UHF band of frequencies, the switch S is changed to insert the feedback circuit B into the oscillatory loop while disconnecting the feedback circuit A. With the feedback circuit B in the oscillatory loop, the oscillator circuit is so designed to oscillate in a second mode of oscillation, with feedback signals being applied to the transistor stage T of such a phase and magnitude to sustain oscillations in the second mode of oscillation at a frequency within the UHF frequency band as determined by a dual resonant circuit D.

Thus, the tunable oscillator of FIG. 1 may be rendered oscillatory in different modes of oscillation by the insertion of either the feedback circuit A or the feedback circuit B. However, the circuit will be oscillatory in two separate and non-interfering bands of frequencies as determined by the particular feedback circuit utilized. Tuning within a given band of frequency may be accomplished by the adjustment of the dual resonant circuit D. It should be observed that the oscillations sustained in each of the frequency bands are independent of one another, in that each of the feedback circuits is so designed to sustain oscillation in a separate mode of oscillation and at frequencies within a given frequency band.

It should also be noted that oscillations are sustained in for example a first mode of oscillation by inserting the feedback circuit A so that the oscillator circuit may be tuned to the dual resonant circuit D to various frequencies within a first frequency band. With the feedback circuit B, however, being inserted into the circuit, the oscillator circuit will be operative in a second mode of oscillation to sustain oscillation at frequencies within a second frequency band. The particulars of the circuitry will be described in further detail with reference to subsequent figures. However, it should be understood that other methods for sustaining or prohibiting oscillation of the circuit may be utilized. For example, the feedback connection between the dual resonant circuit and the transistor stage T may be maintained constant but oscillations may be sustained in either mode of operation of the oscillator circuit by attenuating or damping the undesired mode of oscillation. Also, the combination of controlling the feedback characteristic and damping the undesired mode of operation may be utilized so that the desired mode of oscillation may be selected.

Figure 2:
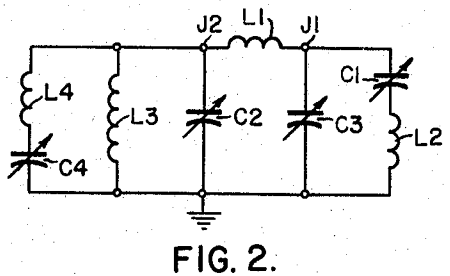
FIG. 2 is a schematic diagram of a resonant circuit as used in FIG. 1.

Considering now FIG. 2, a schematic diagram of the dual resonant circuit D of FIG. 1 is shown. For purposes of simplicity of discussion, the VHF and UHF bands of frequencies will be discussed herein when reference is made to different bands of frequencies. However, it should be understood, of course, that other separate bands of frequency are within the scope and the teachings of this invention.

In FIG. 2, the main variable tuning element is a variable capacitor C1, which acts to determine the oscillatory frequency of the tuning circuit in either the VHF or UHF bands. At one end of the capacitor C1 at a junction J1 is connected an inductor L1 and at the other end of the capacitor C1 to ground is connected an inductor L2. The inductors L1 and L2 are shown in FIG. 2 as being lumped elements. However, as explained in reference to subsequent figures these inductors may be advantageously constructed of distributed lines including inductive reactance at UHF frequencies. Connected from a junction J2 at one end of the inductor L1 to ground is a capacitor C2, and from the junction J1 to ground is a capacitor C3. The capacitors C2 and C3 are variable and serve as trimmer adjustments.

The circuit of FIG. 2 as so far described defines the predominant frequency determining elements for the oscillator in the UHF frequency band. The desired resonant frequency in the UHF band is selected by the adjustment of the capacitor C1, which in cooperation with the inductor L1, primarily, and also the inductor L2, establishes this resonant frequency. The capacitor C2 acts as a trimmer adjustment for the low end of the UHF band, while the capacitor C3 acts as the trimmer adjustment for the high end of the UHF band.

For tuning in the VHF frequency band an inductor L3 is provided, which is connected at the junction J2 of the inductor L1. The principal tuning elements to provide resonant frequencies in the VHF band are the inductor L3 and the capacitor C1. At the VHF frequencies the inductors L1 and L2 are so designed to have substantially negligible inductive reactance and thereby act as direct connections to the capacitor C1. That is, at VHF frequencies the connection between the inductor L3 and the capacitor C1 may be considered a direct one, with the other end of the capacitor C1 being directly grounded.

When the capacitors C2 and C3 are adjusted to obtain the proper frequency range in the UHF frequency band, the upper end of the VHF frequency band is influenced. A series combination of an inductor L4 and a capacitor C4 is connected between the junction J2 and ground in order to obtain a relatively independent adjustment of the top end of the VHF band. Inductor L4 and capacitor C4 are so selected to have a series resonant frequency somewhere within the band between the UHF and VHF bands, see FIG. 3. Having such a series resonant frequency at VHF frequencies, the series combination of the inductor L4 and capacitor C4 is capacitive with the magnitude of the capacitive reactance being primarily dependent upon C4. Under such conditions, the VHF band can therefore be adjusted by the adjustment of the capacitor C4. In the UHF band, however, the effect of adjusting the capacitor C4 is very small, since at UHF frequencies the reactance of the series combination of L4 and C4 is inductive and therefore relatively independent of the capacitor C4. Adjustment of the low end of the VHF band may be obtained by the selection of the inductor L3 which will be subsequently explained.

Figure 3:
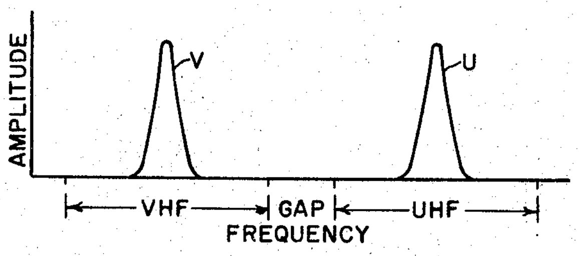
FIG. 3 is a plot of amplitude versus frequency to aid in illustrating the operation of the circuit FIG. 2.

In FIG. 3, there is shown a plot of the frequency response of the dual resonant circuit of FIG. 2 showing the circuit to have two resonant frequencies as indicated by the waveform U in the UHF frequency band and the waveform V in the VHF frequency band. In the UHF band, the resonant frequency is obtained by the adjustment of the capacitor C1, which in cooperation with the line inductors L1 and L2, establishes this frequency. The capacitors C2 and C3, respectively, provide trim adjustment at the low and high ends of the UHF frequency band. For tuning in the VHF frequency band, the variable capacitor C1 is also utilized as the principal variable element. The inductive reactance being primarily provided by the inductor L3. As mentioned above, at VHF frequencies the inductors L1 and L2 provide substantially negligible inductance when compared to the inductance provided thereby in the UHF frequency band. Therefore, at VHF frequencies the inductors L1 and L2 may be considered as direct non-reactive connections having negligible resistance. The adjustment of the lower end of the VHF band is adjusted through the inductor L3, while the upper end is adjusted by the series combination of the inductor L4 and the capacitor C4 which has a series resonant frequency located within the gap between the VHF band and the UHF band. Thus, the series combination of L4 and C4 will be capacitive in the VHF frequency band while inductive in the UHF frequency band. The upper end of the VHF band is thereby adjusted through the capacitor C4 but this adjustment has negligible effect in the UHF frequency band since the series combination of L4 and C4 is inductive in this range.

Figure 4:
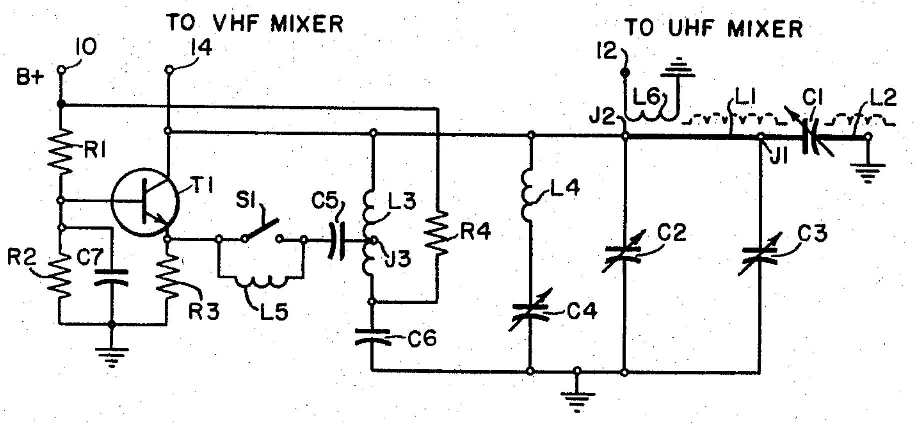
FIG. 4 is a schematic diagram of one embodiment of the present invention.

FIG. 4 shows a schematic diagram embodying the block diagram of FIG. 1 in which a dual resonant circuit such as shown in FIG. 2 is incorporated therein along with separate feedback paths being provided to be inserted into the circuit when oscillation is desired in different frequency bands. A transistor T1 is provided as the active element for the oscillator circuit and supplies the oscillatory energy therefor. The transistor T1 is biased from a B+ source, not shown, which is to be connected to a terminal 10. A bias resistor R1 is connected between the terminal 10 and the base of the transistor 10, with a bias resistor R2 being connected from the base of the transistor T1 to ground. The emitter of the transistor T1 is connected through a resistor R3 to ground. A capacitor C7 is connected between the base of the transistor T1 and ground to provide an A.C. ground for the base of the transistor. A resistor R4 is connected from the bottom end of the inductor L3 to the terminal 10 at B+ potential so as to prevent oscillator signals from appearing on the B+ line.

A large by-pass capacitor C6 is connected from the bottom end of the inductor L3 to ground.

The collector of the transistor T1 is connected into the dual resonant circuit at a point common to the junction J2. Feedback is supplied to the transistor T1 from signals developed at a tap J3 on the inductor L3. The feedback signals at the junction J3 are supplied through a feedback capacitor C5 and a switch S1 to the emitter of the transistor T1. An inductor L5 is connected directly across the switch S1. By the opening and closing of the switch S1 the mode of oscillation of the circuit may be controlled.

With the switch S1 open, as shown, oscillation in the

UHF band will be obtained, while closing the switch S1 will provide oscillation in the VHF frequency band. The opening and closing of the switch S1 controls the modes of oscillation of the oscillator circuit and effects oscillation in the two frequency bands with adjustment of the oscillating frequency within each of these bands being provided by the adjustment of the capacitor C1.

Considering briefly the dual mode circuit as shown in FIG. 4. The inductor L1 is shown schematically to be a distributed line which is capacitively terminated by the variable capacitor C1. A line extension corresponding to the inductor L2 of FIG. 2 completes connection to ground from the capacitor C1. The capacitor C3 is connected at the junction J1 along the line L1 to ground. Output oscillatory signals in the UHF frequency band are taken from an inductive coil L6 which is inductively coupled to the line inductor L1. These output signals are supplied to a UHF mixer, not shown, at a terminal 12 of the coil L6, the other end of the coil L6 being grounded. Oscillatory signals in the VHF frequency band are supplied to a VHF mixer, not shown, from a terminal 14 connected at the collector of the transistor T1.

To tune to frequencies within the UHF band, the switch S1 is opened. Under these conditions, the oscillator circuit will be connected as a negative resistance oscillator with oscillations being maintained in this mode of oscillation by the internal collector-to-emitter feedback impedance. Thus, with the switch S1 opened, a feedback path is provided from the tap J3 on the inductor L3 through the capacitor C5 and the inductor L5 to the emitter of the transistor T1. The inductor L5 serves the function of preventing the oscillation from jumping from the UHF to the VHF frequency band when the high end of the UHF band is being used. If the inductor L5 were not provided the internal collector-to-emitter feedback impedance might be such as to be more favorable for oscillation at the high end of the VHF band. This would cause the oscillation to suddenly jump from the high end of the UHF band to the high end of the VHF band. This is prevented by the use of the coil L5 which neutralizes the feedback impedance between collector and emitter, which is mainly capacitive at the high end of the VHF band. Because the neutralization by the inductor L5 is frequency dependent, this effect is negligible in the UHF band. Thus, at the UHF frequencies the oscillator circuit operates as a negative resistance oscillator with a feedback circuit being so utilized that oscillations are sustained in the UHF frequency band, but with the oscillatory criterion are not being satisfied for oscillation in the VHF frequency band.

To sustain oscillations in the VHF frequency band, the switch S1 is closed thereby switching in a different feedback circuit for the transistor T1. With the capacitor C5 connecting the emitter of the transistor T1 to the junction J3, the capacitor C5 provides the necessary feedback for stable oscillation in the VHF band, and it may be seen that the oscillator circuit is connected as a Hartley oscillator, with feedback signals being fed back from the collector to the emitter of the transistor T1 of such a phase and amplitude to sustain stable oscillations. Oscillations are prevented in the UHF mode, however, since the capacitor C5 and the inductance from the tap J3 on the inductor L3 and the by-pass capacitor C6 to ground constitutes a relatively low impedance from emitter of the transistor T1 to ground. This low impedance path prevents the emitter-to-collector impedance of the transistor T1 from being effective to sustain oscillation in the UHF band when VHF frequencies are being tuned. Thus, by the opening and closing of the switch S1, the feedback characteristics can be selected for independent oscillation in either of the UHF or VHF frequency bands, with a first mode of oscillation being sustained with the switch S1 opened in the UHF frequency band and with a second mode oscillation being sustained in the VHF frequency band with the switch S1 closed.

Figure 5:
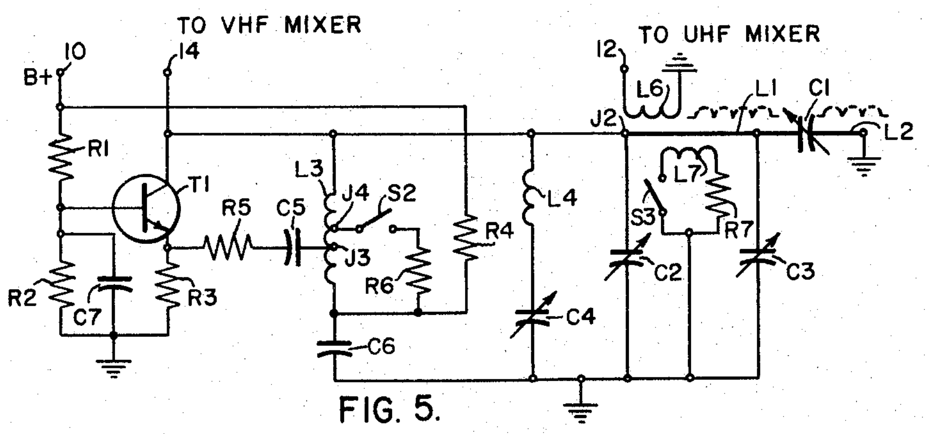
FIG. 5 is a schematic diagram of another embodiment of the present invention.

FIG. 5 shows another embodiment in which the mode of oscillation of the oscillator circuit is selected by damping the unwanted mode rather than changing the feedback characteristics as done in FIG. 4. In FIG. 5, similar reference characters will be used for similar components to those of FIG. 4. There is no feedback path switching in the circuit of FIG. 5 with the junction J3 on the inductor L5 being connected to the emitter of the transistor T1 through the capacitor C5 and a resistor R5. The resistor R5 is chosen to have a large enough impedance value so as to prevent the capacitor C5, the inductance of the inductor L3 and the capacitor C6 from the tap J3 from having a sufficiently low impedance path from the emitter of the transistor T1 to ground. Under these conditions sufficient feedback can be obtained in the UHF frequency band to sustain oscillation. Nonetheless, the resistor R5 has to be selected small enough to give sufficient feedback to sustain oscillations in the VHF frequency band. In order to provide the necessary damping to select the desired mode of oscillation, a switch S2 and a switch S3 are provided. The switch S2 has one end connected to a tap J4 on the inductor L3 and the other end connected through a resistor R6 to the bottom end of the inductor L3. The switch S3 has one end connected to a coil L7 which is inductively coupled to the line inductor L1 of the dual resonant circuit. A resistor R7 completes the circuit connection between the switch 53 and the coil L7.

To sustain oscillation in the UHF frequency band, the switch S2 is closed and the switch S3 is opened as shown in FIG. 5. Because of the stray inductance associated with the connection at the tap J4, the damping provided by the resistance R6 with the switch S2 closed will be mainly effective at VHF frequencies. Therefore, the resonant frequency in the VHF range provided by the dual resonant circuit will be substantially damped and thus will be ineffective to sustain oscillations with the switch S2 closed. When tuning in the VHF range is desired, the switch S3 is closed and the switch S2 is opened. With the switch S3 closed and the coil L7 being inductively coupled to the line inductor L1, the resonant frequency in the UHF band will be substantially attenuated, with the resistor R7 providing a frequency dependent damping effect to frequencies in the UHF band. The circuit of FIG. 5 is otherwise similar in operation to that of FIGURE 4 with the circuit sustaining oscillations in the UHF band, the oscillator circuit being operative in a negative resistance mode, and oscillations being sustained in the VHF mode with the oscillator operative in a Hartley mode of oscillation.

Figure 6:
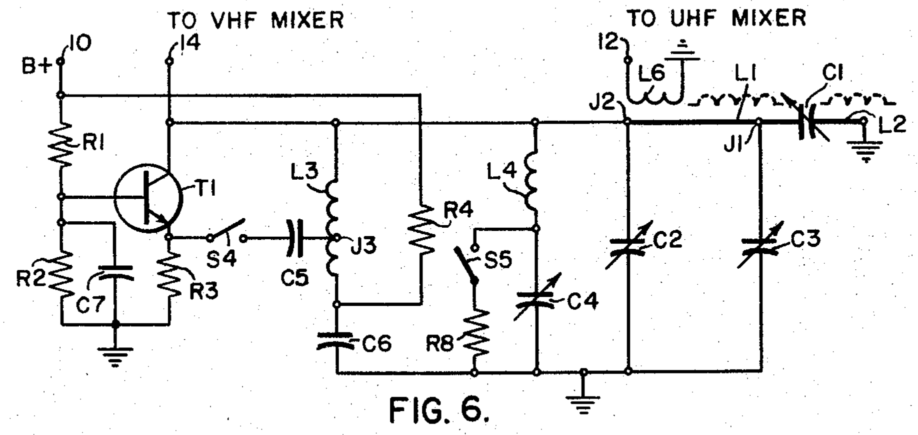
FIG. 6 is a schematic diagram of another embodiment of the present invention.

FIG. 6 shows another embodiment in which a combination of the methods of FIGS. 4 and 5 are used. In FIG. 6, the feedback connection is changed for oscillations in the different bands as well as the unwanted mode of vibration being damped so that oscillation may be sustained in the desired mode. The reference numerals in FIG. 6 are designated similarly to those of FIGS. 4 and 5. In FIG. 6, a switch S4 selectively connects the feedback capacitor C5 to the emitter of the transistor T1. Also, a switch S5 and a resistor R8 are connected in series and across the capacitor C4. For tuning in the UHF band, the switch S4 is opened and the switch S5 is closed. With the resistor R8 shunted across the capacitor C4 in cooperation with the inductor L4 and capacitor C4, a highly frequency dependent damping at VHF frequency is provided, but which provides substantially no damping at UHF frequencies. As discussed above, the series combination of the inductor L4 and the capacitor C4 were selected to have a resonant frequency in the gap between the UHF and VHF frequency bands. Since the switch S4 is opened, sufficient feedback is provided so as to sustain oscillation at UHF frequencies with the circuit oscillating in a negative resistance mode. In order to provide tunable oscillation in the VHF band, the switch S4 is closed and the switch S5 is opened. The switch S4 being closed, proper amplitude and phase feedback signals will be provided from the tap J3 on the inductor L3 which sustain oscillations in the Hartley mode. In the UHF band of frequencies, however, feedback will be greatly attenuated due to the low impedance path from emitter to ground for the transistor T1 thereby prohibiting oscillation at UHF frequencies. Thus, in FIG. 6 the desired mode of oscillation is selected in the UHF band by providing proper feedback through the opening of the switch S4 and damping the unwanted mode by closing the switch S5. In the VHF band the desired mode is selected by increasing the feedback for the wanted mode by closing the switch S4 which also reduces the feedback for the unwanted mode.

In FIGS. 4, 5 and 6, a line extension L2 is utilized which connects one end of the variable main tuning capacitor C1 to ground. The function of the line extension L2 is to extend the tuning range of the oscillator circuit in the UHF band. That is, an increased range of tuning will be obtained through the use of the line extension L2 than would otherwise be obtained by the use of the line L1 terminated merely with the capacitor C1. This may be seen from the following. At the high end of the UHF band, the resonant frequency of the dual resonant circuit is determined principally by the capacitor C2, the line inductor L1 and the distributed capacity of the line L1. The line extension L2 has little effect at the upper end of the UHF band, with the variable capacitor supplying its minimum capacitive value. At the low end of the UHF band, however, the frequency is principally determined by the capacitor C3, the line inductor L1, the variable capacitor C4 and the line extension inductor L2. The line extension L2 thus lowers the resonant frequency at the low end of the UHF band, but does not affect the frequency at the upper end of the UHF band. This means that an extended tuning range in the UHF band results. Also, the ratio of frequency from the high to the low end is larger than the square root of the capacity ratio. Thus, a substantially lower value for the capacitor C3 may be utilized, which is highly desirable since the capacitor C3 is an essential part of the minimum capacity value for operation in the VHF band.

Figure 7:
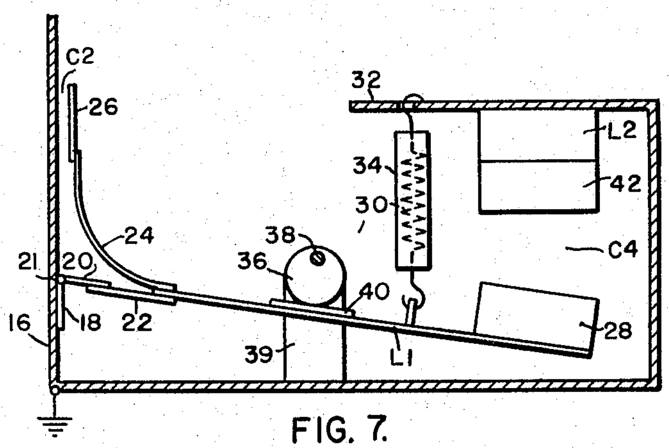
FIG. 7 is a sectional view of the mechanical implementation of a portion of the oscillator circuitry of the present invention.

In FIGURE 7, a mechanization of the arrangement of the line inductor L1 and the line extension L2 and the variable capacitor C1 is shown which illustrates the function of the line extension L2. A base member 16 is provided comprising a metallic material and which is affixed at ground potential. Secured to the base member 16 is a hinge member 18 which has an arm 20 free to rotate about a horizontal axis 21. Secured to the arm 20 is an insulating member 22. The line inductor L1 is secured to the other end of the insulating member 22. Also secured to the end of the line L1 is a foil spring 24, which has its other end connected to a capacitor plate 26. Between the capacitor plate 26 and the base member 16, the capacitance as described schematically by capacitor C2 is developed. At the other end of the inductive line L1 a rotor capacitor plate 28 is secured. A spring 30 is connected between the inductive line L1 and a top portion 32 of the base member 16. The spring has a cover member 34 which acts to comprise conductive material to prevent the spring itself from acting as an absorptive circuit in the UHF band.

A cam 36 is provided which is rotaable about an axis 38 which is fitted in a member 39 mounted on the base member 16. The cam is an eccentric one and is so situated to engage an electrically insulating cam follower 40 disposed on the inductor line L1. The spring 30 acts as a reactive force for the force applied by the cam 36. By the rotation of the cam 36 about the axis 38 the position of the rotor capacitor plate 28 may be varied with respect to a stator capacitor plate 42 disposed thereabove. The line extension L2 is secured to the stator plate 42 and to the top portion 32 of the base member 16. The capacitance shown schematically by the variable capacitor C1 is developed between the plates 28 and 42.

In the position as shown in FIG. 7, the rotor plate 28 is at its farthest position from the stator plate 42. In the position shown tuning at the high end of the UHF band may be accomplished with the resonant frequency being determined mainly by the capacitance C2, provided between the plate 26 and the base member 16, the length of the inductor line L1 and any distributed capacitance thereof. In the condition as shown in FIG. 7, the stator plate 42 and the line extension L2 have very little effect upon the frequency being tuned. When tuning however at the low end of the UHF frequency band, the resonant frequency will be principally determined by the capacitance C2, the length of the line inductor L1 and the capacitance C1 between the plates 28 and 42 and the line extension L2, since the plates 28 and 42 will be closer together at the low end of the UHF band. Because of the increased induction due to the line extension inductor L2, a lower resonant frequency may be obtained at the low end of the UHF frequency and the advantages as described above may be attained.

The mechanism as described in FIG. 7 is, of course, operative to tune in the VHF frequency band by the adjustment of the capacitive value C1 between the plates 28 and 42, when the proper mode of oscillation is selected as described with reference to FIGS. 4, 5 and 6.

Although the present invention has been described with a certain degree of particularity, it should be understood that the present disclosure has been made only by way of example and that numerous changes in the details of construction and the combination and arrangement of parts, elements, circuitry and the particular frequency bands that are utilized could be made without departing from the scope and the spirit of the present invention.

I claim as my invention:

1. An oscillator circuit operative to oscillate in at least two modes and tunable to frequencies within at least two frequency bands comprising: signal amplifying means for supplying oscillatory energy; a resonant circuit operative to receive energy from said signal amplifying means and tunable to frequencies within each of said frequency bands and including a variable capacitor for tuning to frequencies within each of said frequency bands, a distributed line inductor connected to said capacitor for providing inductive reactance for tuning at frequencies within one of said frequency bands but providing substantially no inductive reactance for tuning at frequencies within another of said frequency bands, a tuning inductor operatively connected to said capacitor and said distributed line inductor for providing inductive reactance for tuning within the other of said bands; and mode selection means operatively connected between said signal amplifying means and said resonant circuit for establishing proper oscillatory conditions to sustain oscillation at a desired mode of oscillation of said oscillator circuit while prohibiting oscillation of said oscillator circuit at undesired modes.

2. An oscillator circuit operative in at least two modes of oscillation and tunable to frequencies within at least two frequency bands comprising: signal amplifying means for supplying oscillatory energy to said oscillator circuit; a resonant circuit tunable to frequencies within said frequency bands and including a variable capacitor for tuning to frequencies within each of said frequency bands, a distributed line inductor is connected to said capacitor for providing inductive reactance for tuning at frequencies within one of said frequency bands but providing substantially no inductive reactance for tuning at frequencies within another of said frequency bands, a tuning inductor operatively connected to said capacitor and said distributed line inductor for providing inductive reactance for tuning within the other of said bands, and line extension distributed inductor connected to said capacitor for extending the tuning range in one of said frequency bands; and feedback control means operatively connected between said signal amplifying means and said resonant circuit for selecting the desired feedback characteristic to sustain oscillations in a desired mode of oscillation of said oscillator circuit while prohibiting oscillation in undesired modes.

3. An oscillator circuit operative in at least two modes of oscillation and tunable to frequencies within at least two frequency bands comprising: signal amplifying means for supplying oscillatory energy; a resonant circuit tunable to frequencies within said frequency bands and including a variable capacitor for tuning to frequencies within each of said frequency bands, a distributed line inductor connected to said capacitor for providing inductive reactance for tuning at frequencies within one of said bands of frequency but providing substantially no inductive reactance for tuning at frequencies within other of said bands of frequencies, a tuning inductor operatively connected to said capacitor and said distributed line inductor for providing inductive reactance for tuning within the other of said bands; and damping control means operatively connected between said signal amplifying means and said resonant circuit for establishing a desired mode of oscillation of said oscillator circuit by damping undesired modes of oscillation.

4. An oscillator circuit operative in at least two modes of oscillation and tunable to frequencies within at least two frequency bands comprising: signal amplifying means for supplying oscillatory energy for said oscillator circuit; a resonant circuit tunable to frequencies within said frequency bands including a variable capacitor for tuning to frequencies within each of said frequency bands, a distributed line inductor connected to said capacitor for providing inductive reactance for tuning at frequencies within one of said frequency bands but providing substantially no inductive reactance for tuning at frequencies within other of said frequency bands, a tuning inductor operatively connected to said capacitor and said distributed line inductor for providing inductive reactance for tuning within the other of said bands; and control means operatively connected between said signal amplifying means and said resonant circuit for establishing the desired mode of oscillation of said oscillator circuit by selecting the feedback characteristic to sustain oscillation in a desired mode and by damping the undesired mode of oscillation.

5. A resonant circuit tunable to frequencies within at least two frequency bands comprising: variable capacitor means for tuning said resonant circuit to frequencies within each of said frequency bands; a first inductive means operatively connected to said variable capacitive element to provide inductive reactance for tuning said resonant circuit within a first of said frequency bands but providing substantially no inductive reactance at frequencies within a second of said frequency bands; second inductive means operatively connected to said variable capacitive means for providing inductive reactance for tuning said resonant circuit at frequencies within the second of said frequency bands; trimmer means connected to said first inductor for adjusting the high and low ends of said frequency bands; and a series resonant circuit connected to said first inductor to prevent jumping between said bands.

6. A resonant circuit tunable to frequencies within at least two frequency bands comprising: a variable capacitor for tuning said resonant circuit to frequencies within each of said frequency bands; a first inductor operatively connected to said variable capacitor to provide inductive reactance for tuning said resonant circuit within a first of said frequency bands but providing substantially no inductive reactance at frequencies within a second of said frequency bands; a second inductor operatively connected to said variable capacitor means for providing inductive reactance for tuning said resonant circuit at frequencies within the second of said frequency bands; a trimmer capacitor connected to said first inductor for adjusting the high and low ends of said first band; a series resonant circuit connected to said first inductor and resonant at frequencies between said two bands and operative to prevent jumping between said bands and for adjusting the high end of said second band; and a third inductor operatively connected to said variable capacitor and providing inductive reactance at frequencies within said first band for extending the frequency range of said first band.

7. A resonant circuit tunable to frequencies within at least two frequency bands comprising: a variable capacitor for tuning said resonant circuit to frequencies within each of said frequency bands; a distributed line inductor element connected to said variable capacitive element to provide inductive reactance for tuning said resonant circuit within a first of said frequency bands but providing substantially no inductive reactance at frequencies within a second of said frequency bands; an inductor connected to said element and operative with said variable capacitor means for providing inductive reactance for said tuning resonant circuit at frequencies within the second of said frequency bands; a trimmer capacitor connected to said element for adjusting the high and low ends of the first band; a series resonant circuit connected to said element resonant at frequencies between said bands and for adjusting the high end of said second band; and a line extension inductive element connected to said variable capacitor for extending the frequency range of said first band at the low end thereof.

8. A tuning element comprising, a base member, a distributed inductive line member pivotally mounted on said base member, a first capacitor plate member mounted on said line member, a second capacitor plate member disposed a distance from said first plate member with a capacitance being developed across said first and second plate members, a line extension inductive member connected between said second plate member and said base member, means to adjust the distance between said first and second plate members to vary the capacitance developed thereacross, and a third capacitor plate member operatively connected to said line member and dispose a distance from said base member and movable with respect thereto to develop a trimming capacitance therebetween.

References Cited

UNITED STATES PATENTS

| | | | |
|---|---|---|---|
| 2,034,974 | 3/1936 | Cotter et al. | 331—167 |
| 2,913,683 | 11/1959 | Mason | 334—44 X |
| 3,252,096 | 5/1966 | Carlson | 334—41 X |

ROY LAKE, *Primary Examiner.*

S. H. GRIMM, *Assistant Examiner.*